(12) United States Patent
Khalid

(10) Patent No.: US 6,714,449 B2
(45) Date of Patent: Mar. 30, 2004

(54) SENSE AMPLIFIER SUITABLE FOR ANALOGUE VOLTAGE LEVELS

(75) Inventor: Shahzad B. Khalid, Union City, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/350,874

(22) Filed: Jan. 24, 2003

(65) Prior Publication Data

US 2003/0112661 A1 Jun. 19, 2003

Related U.S. Application Data

(62) Division of application No. 09/671,793, filed on Sep. 27, 2000, now Pat. No. 6,538,922.

(51) Int. Cl.[7] .............................................. G11C 16/04
(52) U.S. Cl. ............................ 365/185.03; 365/185.02; 365/185.24; 327/51
(58) Field of Search ....................... 365/185.03, 185.02, 365/185.24, 185.21, 45; 327/51

(56) References Cited

U.S. PATENT DOCUMENTS

| | | |
|---|---|---|
| 4,802,166 A | 1/1989 | Casagrande et al. |
| 4,949,307 A | 8/1990 | Campardo |
| 4,974,206 A | 11/1990 | Iyama et al. |
| 5,010,518 A | 4/1991 | Toda |
| 5,043,940 A | 8/1991 | Harari |
| 5,081,610 A | 1/1992 | Olivo et al. |
| 5,095,344 A | 3/1992 | Harari |
| 5,142,496 A | 8/1992 | Van Buskirk |

(List continued on next page.)

FOREIGN PATENT DOCUMENTS

| | | |
|---|---|---|
| EP | 0814480 A1 | 12/1997 |
| EP | 0936627 A1 | 8/1999 |

(List continued on next page.)

OTHER PUBLICATIONS

"Communication Relating to the Results of the Partial International Search", From International application No. PCT/US01/30123, dated Sep. 20, 2002, 9 pages.

Primary Examiner—Michael S. Lebentritt
Assistant Examiner—Toan Le
(74) Attorney, Agent, or Firm—Parsons Hsue & de Runtz LLP

(57) ABSTRACT

The present invention presents several techniques for using writable tracking cells. Multiple tracking cells are provided for each write block of the memory. These cells are re-programmed each time the user cells of the associated write block are written, preferably at the same time, using the same fixed, global reference levels to set the tracking and user cell programmed thresholds. The threshold voltages of the tracking cells are read every time the user cells are read, and these thresholds are used to determine the stored logic levels of the user cells. In one set of embodiments, populations of one or more tracking cells are associated with different logic levels of a multi-state memory. These tracking cell populations may be provided for only a subset of the logic levels. The read points for translating the threshold voltages are derived for all of the logic levels based upon this subset. In one embodiment, two populations each consisting of multiple tracking cells are associated with two logic levels of the multi-bit cell. In an analog implementation, the user cells are read directly using the analog threshold values of the tracking cell populations without their first being translated to digital values. A set of alternate embodiments provide for using different voltages and/or timing for the writing of tracking cells to provide less uncertainty in the tracking cells' final written thresholds.

2 Claims, 8 Drawing Sheets

U.S. PATENT DOCUMENTS

| | | | |
|---|---|---|---|
| 5,172,338 | A | 12/1992 | Mehrotra et al. |
| 5,198,997 | A | 3/1993 | Arakawa |
| 5,267,202 | A | 11/1993 | Dallabora et al. |
| 5,270,979 | A | 12/1993 | Harari et al. |
| 5,287,315 | A | 2/1994 | Schreck et al. |
| 5,293,345 | A | 3/1994 | Iwahashi |
| 5,311,466 | A | 5/1994 | Natale et al. |
| 5,313,421 | A | 5/1994 | Guterman et al. |
| 5,315,541 | A | 5/1994 | Harari et al. |
| 5,386,388 | A | 1/1995 | Atwood et al. |
| 5,408,148 | A | 4/1995 | Pascucci et al. |
| 5,418,752 | A | 5/1995 | Harari et al. |
| 5,430,859 | A | 7/1995 | Norman et al. |
| 5,434,825 | A | 7/1995 | Harari |
| 5,453,955 | A | 9/1995 | Sakui et al. |
| 5,463,586 | A | 10/1995 | Chao et al. |
| 5,493,533 | A | 2/1996 | Lambrache |
| 5,532,623 | A | 7/1996 | Advani et al. |
| 5,532,962 | A | 7/1996 | Auclair et al. |
| 5,537,358 | A | 7/1996 | Fong |
| 5,541,886 | A | 7/1996 | Hasbun |
| 5,546,351 | A | 8/1996 | Tanaka et al. |
| 5,602,987 | A | 2/1997 | Harari et al. |
| 5,608,676 | A | 3/1997 | Medlock et al. |
| 5,629,892 | A | 5/1997 | Tang |
| 5,642,308 | A | 6/1997 | Yoshida |
| 5,684,739 | A | 11/1997 | Takeuchi |
| 5,687,114 | A | 11/1997 | Khan |
| 5,687,115 | A * | 11/1997 | Wong et al. ............ 365/185.03 |
| 5,712,189 | A | 1/1998 | Plumton et al. |
| 5,754,475 | A | 5/1998 | Bill et al. |
| 5,774,395 | A | 6/1998 | Richart et al. |
| 5,787,038 | A | 7/1998 | Park |
| 5,818,759 | A | 10/1998 | Kobayashi |
| 5,828,601 | A | 10/1998 | Hollmer et al. |
| 5,828,602 | A | 10/1998 | Wong |
| 5,847,996 | A | 12/1998 | Guterman et al. |
| 5,886,927 | A | 3/1999 | Takeuchi |
| 5,889,702 | A | 3/1999 | Gaultier et al. |
| 5,912,838 | A | 6/1999 | Chevallier |
| 5,936,888 | A | 8/1999 | Sugawara |
| 5,936,906 | A | 8/1999 | Tsen |
| 5,946,238 | A | 8/1999 | Campardo et al. |
| 5,966,330 | A | 10/1999 | Tang et al. |
| 5,973,959 | A | 10/1999 | Gerna et al. |
| 5,982,662 | A | 11/1999 | Kobayashi |
| 6,002,614 | A | 12/1999 | Banks |
| 6,016,272 | A | 1/2000 | Gerna et al. |
| 6,016,276 | A | 1/2000 | Fuji |
| 6,021,068 | A | 2/2000 | Miki et al. |
| 6,028,791 | A | 2/2000 | Tankaka |
| 6,055,187 | A | 4/2000 | Dallabora et al. |
| 6,094,368 | A | 7/2000 | Ching |
| 6,103,573 | A | 8/2000 | Harari et al. |
| 6,219,277 | B1 | 4/2001 | Devin et al. |
| 6,222,762 | B1 | 4/2001 | Guterman et al. |
| 6,314,014 | B1 | 11/2001 | Lowrey et al. |
| 6,317,363 | B1 | 11/2001 | Guterman et al. |
| 6,426,893 | B1 * | 7/2002 | Conley et al. ......... 365/185.11 |
| 6,512,263 | B1 * | 1/2003 | Yuan et al. ................. 257/316 |

FOREIGN PATENT DOCUMENTS

| | | |
|---|---|---|
| EP | 0961285 A1 | 12/1999 |
| EP | 0978844 A1 | 2/2000 |
| EP | 0987715 A1 | 3/2000 |
| FR | 2778012 A1 | 4/1998 |
| JP | 4291940 A | 10/1992 |
| JP | 7287984 A | 1/1995 |
| JP | 9139089 A | 5/1997 |
| JP | 9219095 A | 8/1997 |
| JP | 9270195 A | 10/1997 |
| JP | WO 98/03978 | 1/1998 |
| JP | 10134587 | 5/1998 |
| JP | 11066875 | 3/1999 |
| JP | 11274437 | 10/1999 |
| JP | 2000057783 | 2/2000 |
| KR | 97029866 | 6/1997 |
| WO | WO 95/20224 | 7/1995 |
| WO | WO 66/08284 | 2/1999 |
| WO | WO 00 42615 | 7/2000 |

* cited by examiner

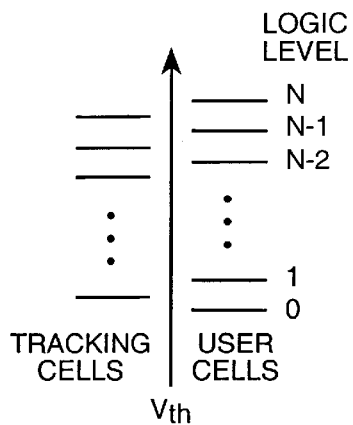
FIG._1
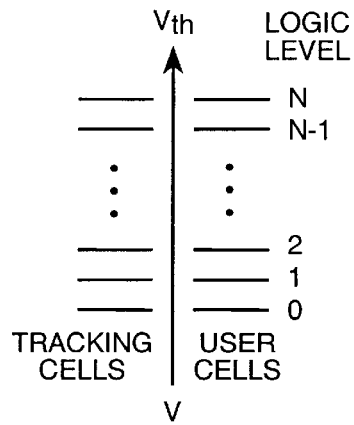
FIG._3
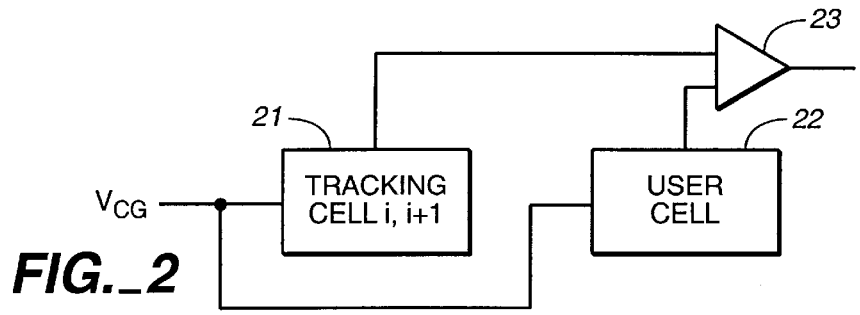
FIG._2
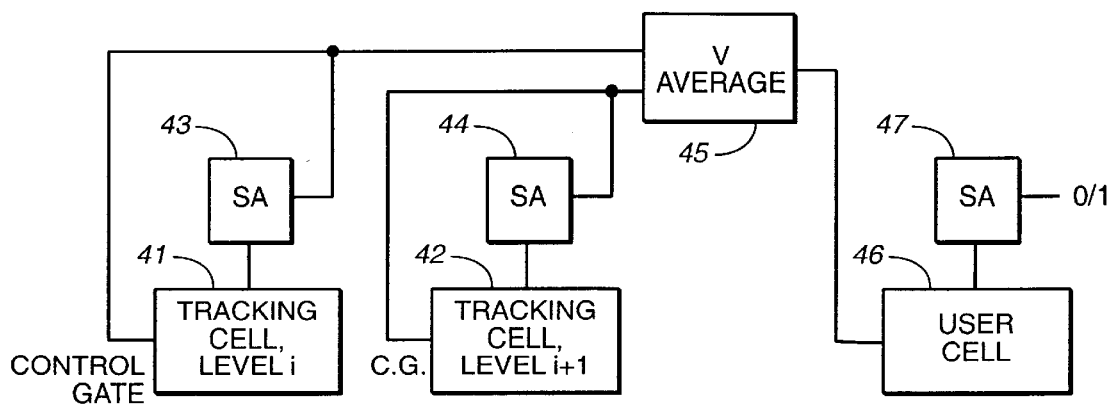
FIG._4

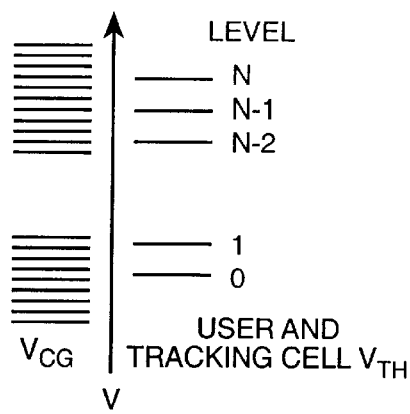
FIG._5
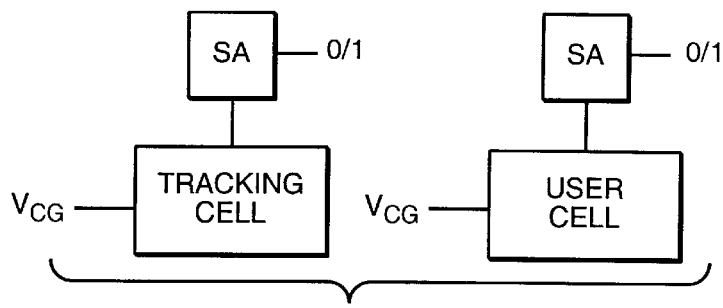
FIG._6
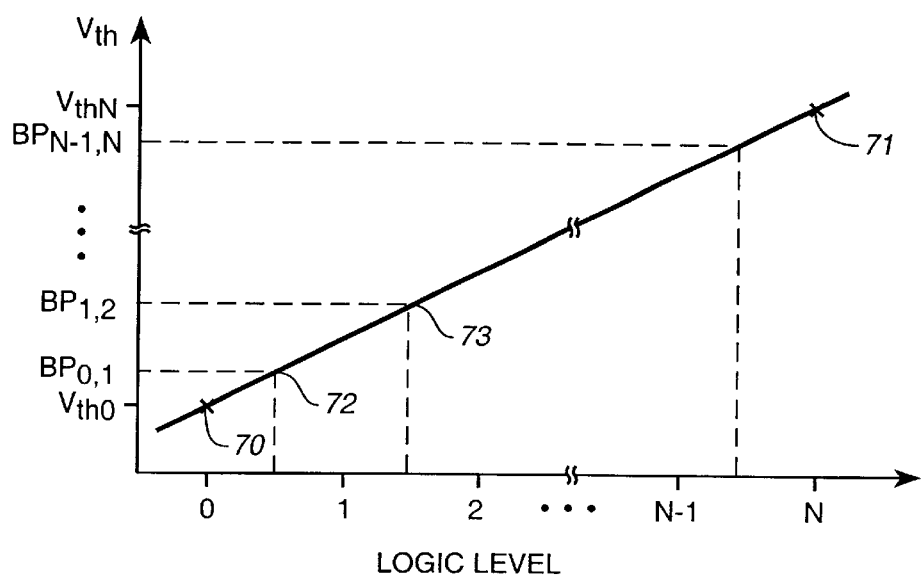
FIG._7

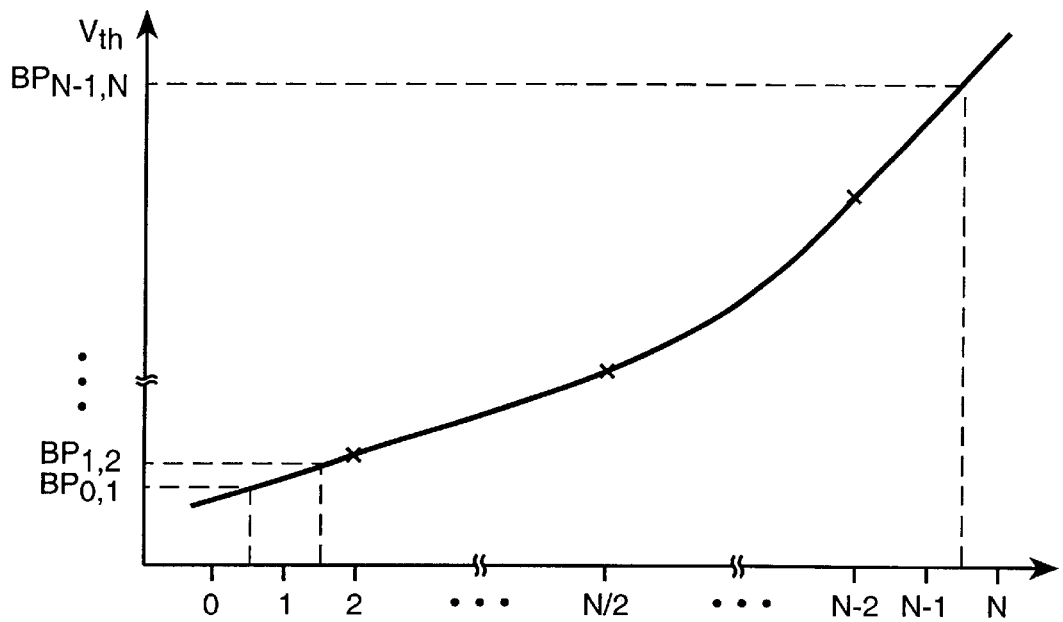
FIG._8
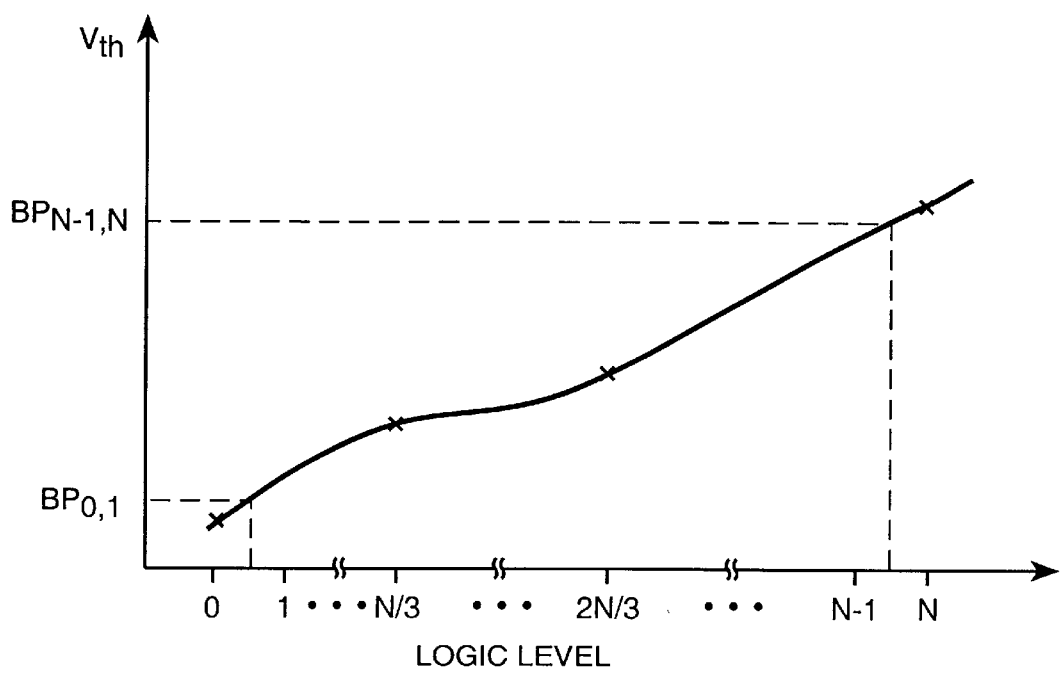
LOGIC LEVEL
FIG._9

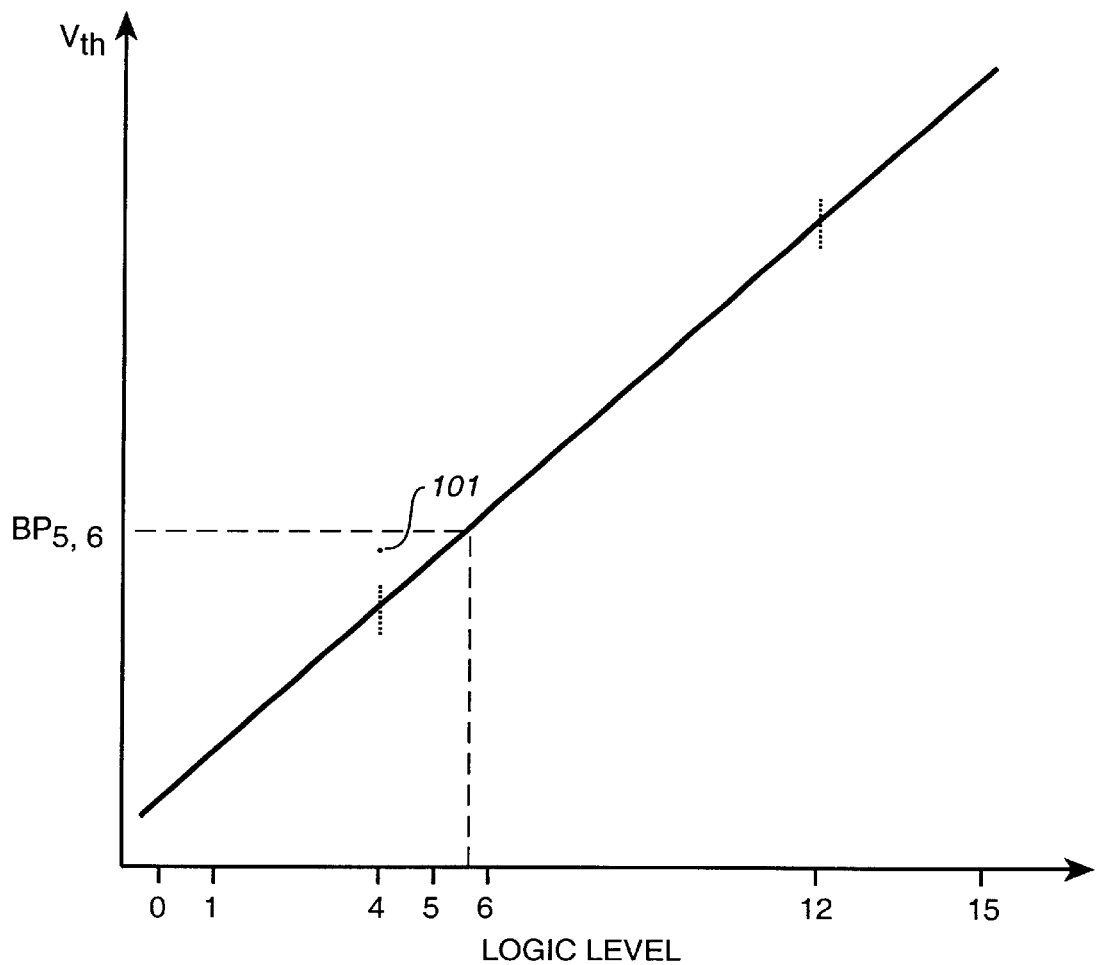
FIG._10

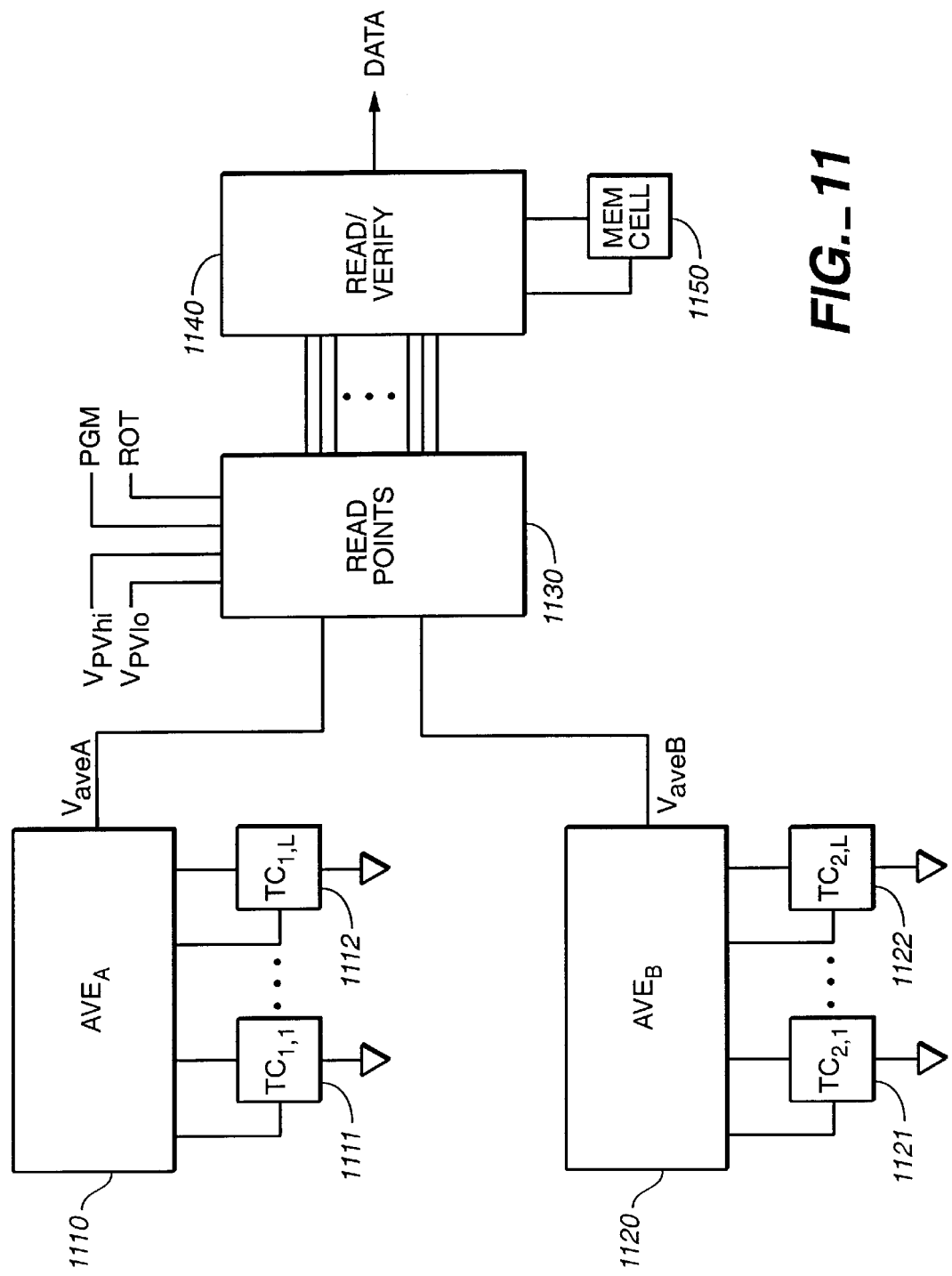
FIG._11

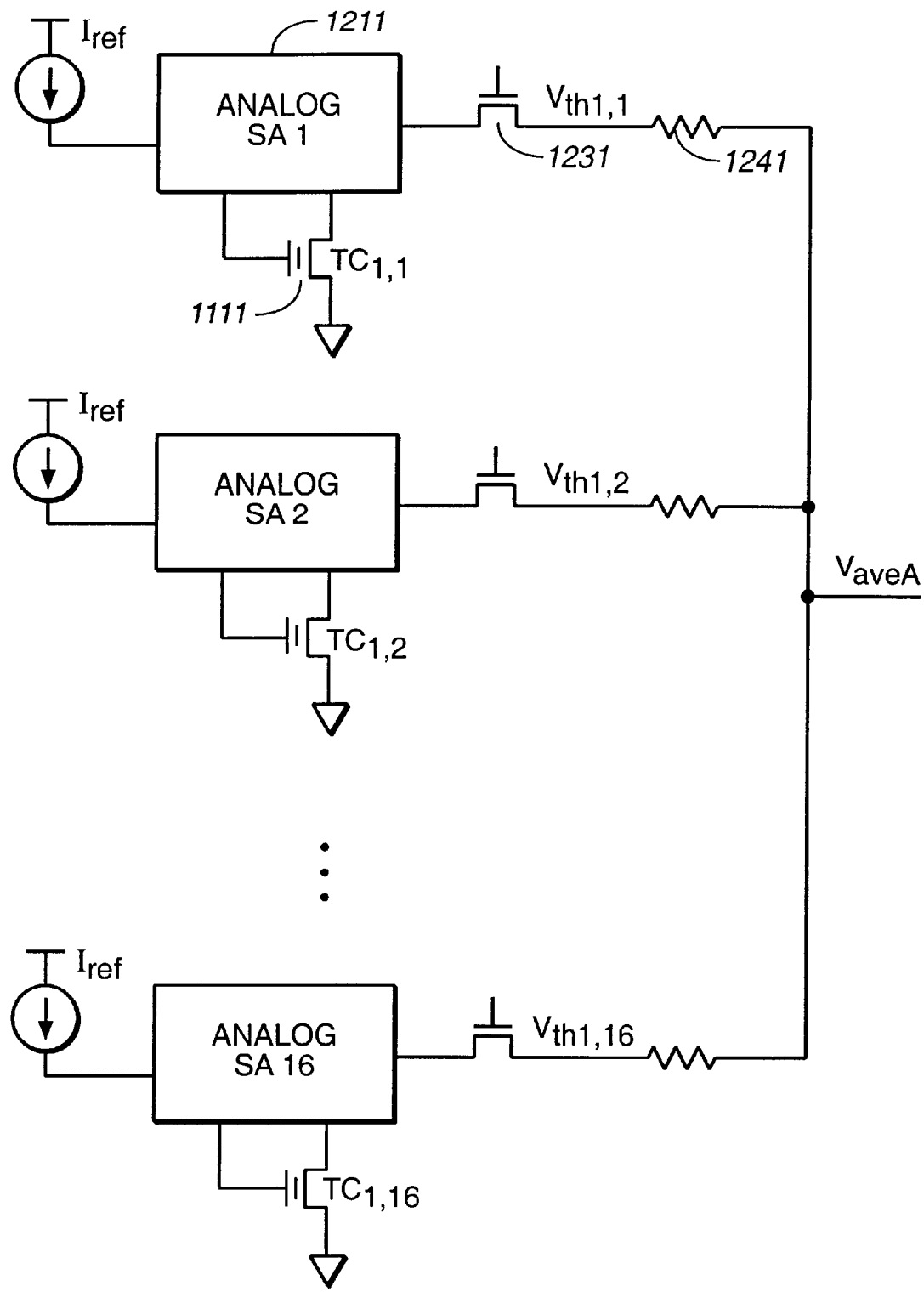
FIG._12

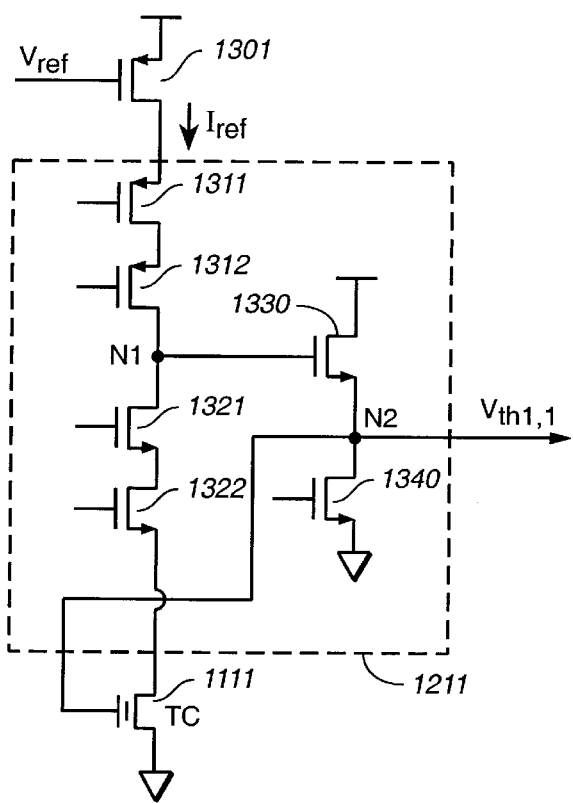
FIG._13
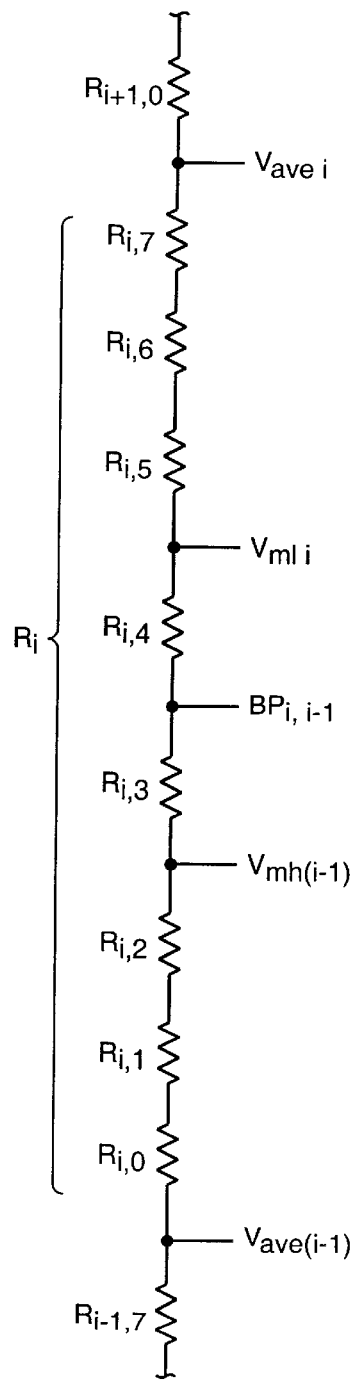
FIG._15

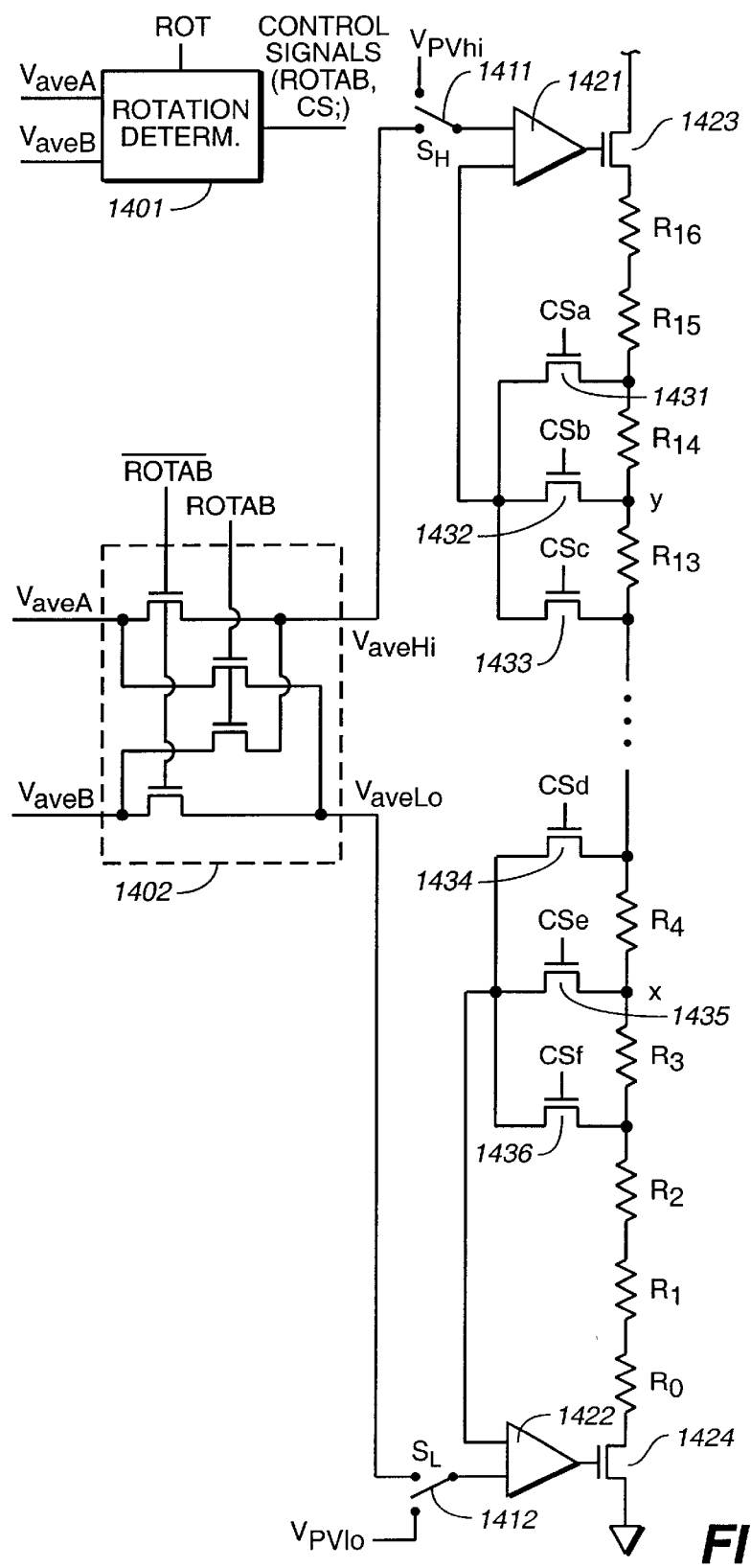
FIG._14

SENSE AMPLIFIER SUITABLE FOR ANALOGUE VOLTAGE LEVELS

This is a division of U.S. application Ser. No. 09/671,793, filed Sep. 27, 2000, now U.S. Pat. No. 6,538,922.

BACKGROUND OF THE INVENTION

1. Field of the Invention

The present invention relates generally to non-volatile semiconductor memory devices and, more particularly, to the use of tracking cells for the reading of multi-state memories.

2. Background Information

In a semiconductor memory cell, data is stored by programming the cell to have a desired threshold voltage. The data stored in the cell is read by determining the threshold voltage of the cell and translating this voltage to a logic level. For a two state, binary memory cell, this translation can be done by use of a reference or breakpoint voltage to provide a read point: cells with a threshold voltage above this read point correspond to one state, while those with a threshold voltage below this read point correspond to the other state. When a memory cell is a multi-state cell, a number of such read points need to be introduced to distinguish between the states.

As the number of states stored in a memory cell increases, more states must be contained within a range of threshold values. Consequently, the portion of this range corresponding to a given state become ever narrower and the read points become ever closer. Once the memory cells have been programmed, their threshold values may change from the level to which they were programmed for a number of reasons. This can be due to the less than perfect charge retention in non-volatile memories, where a cell's threshold may go up or down depending on applied bias voltages, fields generated by the stored charge itself, and charge trapped in dielectrics. It can also be due to changes in operating conditions between when the cell is programmed and when it is read. If the read points used to determine the data content of the cells do not follow these changes in the cell, the read points will no longer accurately discriminate between the different threshold voltages. This is the case when a fixed, global set of reference voltages, such as from a band-gap circuit, is used to produce the read points. Such a circuit will not respond, or respond differently, to the conditions which lead the threshold voltages of the memory cells to change. When this change becomes large enough, the read points will no longer accurately discriminate between the threshold voltages found on the cells and the data programmed can no longer be accurately read.

One method to improve the accuracy of the correspondence between the read points and threshold voltage of the cells programmed to a particular data state at the time these cells are read is the use of writable reference or tracking cells. These are a set of memory cells, but which are not written with data and instead are written to predetermined reference values. The read points are then extracted from these cells, which, as they will behave similarly to the data cells, will provide a more accurate correspondence between a data level and the current threshold voltage of a cell originally programmed to that level. The use of reference cells in multi-state memories are described in U.S. Pat. No. 5,172,338 and further developed in U.S. patent application Ser. No. 08/910,947, now U.S. Pat. No. 6,222,762, filed on Aug. 7, 1997, both of which are assigned to SanDisk Corporation and both of which are hereby incorporated herein by this reference.

As the number of states per cell continues to increase, further improvements in the accuracy of the reading process will be needed. Therefore, improvements in tracking cell techniques are needed which not only increase their accuracy and speed of use, but also decrease the amount of overhead they require, both in terms of the actual tracking cells and also in terms of the related circuitry.

SUMMARY OF THE PRESENT INVENTION

The present invention presents several techniques for using writable tracking cells. Multiple tracking cells are provided for each write block of the memory. These cells are re-programmed each time the user cells of the associated write block are written, preferably at the same time, using the same fixed, global reference levels to set the tracking and user cell programmed thresholds. The threshold voltages of the tracking cells are read every time the user cells are read, and these thresholds are used to determine the stored logic levels of the user cells.

In one set of embodiments, populations of one or more tracking cells are associated with different logic levels of a multi-state memory. These tracking cell populations may be provided for only a subset of the logic levels. The read points for translating the threshold voltages are derived for all of the logic levels based upon this subset. In one embodiment, two populations each consisting of multiple tracking cells are associated with two logic levels of the multi-bit cell. Based on the threshold values of this pair of populations, a linear logic level vs. threshold level relation is able to translate the threshold values of the user cells into any of the logic levels. In this way, the logic level of a data cell may be determined based upon a population of tracking cells associated with a non-adjacent logic level. By using more tracking cell populations, more complex relations between the cell threshold values and logic levels can be obtained.

The reading of data cells through use of tracking cells can have digital or analog implementations. In digital implementations, the threshold voltages of the tracking cells are read with a greater resolution than the number of bits stored in the data cells. The controller or other circuitry then converts these higher resolution values to translate the user cell threshold values into the lower logic levels, either by reading cells at the lower resolution level or by translating the user cell values read at the higher resolution into the logic levels. In an analog implementation, the user cells are read directly using the analog threshold values of the tracking cell populations without their first being translated to digital values. An exemplary analog embodiment provides each write sector with a dedicated analog sense amp for each tracking cell, an averaging circuit for each population of tracking cells, and a chain of resistive elements to provide all of the needed read points from the averaged values.

A set of alternate embodiments provide for using different voltages and/or timing for the writing of tracking cells to provide less uncertainty in the tracking cells' final written thresholds. Since there are typically many fewer tracking cells than user storage cells, system write speed is most often limited by the user cells, not the reference cells. Therefore, it may be possible to use different voltages and/or timings which write the reference cells more slowly on average while still writing the slowest reference cell as quickly as the slowest user cell. This can reduce reference cell threshold uncertainty without significantly effecting the overall system write speed.

Additional objects, advantages, and features of the present invention will become apparent from the following description of its preferred embodiments, which description should be taken in conjunction with the accompanying drawings.

BRIEF DESCRIPTION OF THE DRAWINGS

FIG. 1 shows a relation between tracking cell thresholds and those of the user cells.

FIG. 2 is a block diagram of an analog arrangement of differential sensing used directly to compare individual tracking cell thresholds to user cell thresholds.

FIG. 3 shows an alternate relation between tracking cell thresholds and those of the user cells.

FIG. 4 is a schematic representation of an arrangement of differential sensing using multiple tracking cells.

FIG. 5 shows a range of control gate voltages spanning the entire range of the expected cell threshold values.

FIG. 6 is a block diagram of an arrange for using the levels of FIG. 5 to determine the cell thresholds.

FIG. 7 shows such a system in which a linear relation is assumed between thresholds and logic levels.

FIG. 8 shows tracking cells programmed to three different logic levels to allow extraction of a non-linear relationship between threshold and logic level.

FIG. 9 shows four logic levels used to allow extraction of an even more complex non-linear relationship between threshold and logic level.

FIG. 10 shows multiple tracking cells associated with a given logic level.

FIG. 11 is a block diagram of an embodiment where the user cells are read directly with analog voltage levels derived from the tracking cells.

FIG. 12 is a detail of FIG. 11 showing an embodiment of the circuit $AVE_A$ 1110 and its tracking cells in more detail.

FIG. 13 shows an embodiment of an analog sense amp connected to its tracking cell.

FIG. 14 is a particular embodiment of the read point circuit of FIG. 11.

FIG. 15 is a detail of one of the resistors $R_i$ in FIG. 14 showing where it is tapped to provide the various values used.

DESCRIPTION OF THE PREFERRED EMBODIMENT

The storage capacity of non-volatile semiconductor memories has increased both by the reduction in size of the individual components of the circuits and by increasing the amount of data storable in an individual memory cell. For example, devices such as those described in U.S. Pat. Nos. 5,712,189 and 6,103,573 and U.S. patent applications Ser. No. 09/505,555, now U.S. Pat. No. 6,426,893, filed on Feb. 17, 2000, and one entitled "Non-Volatile Memory Cell Array Having Discontinuous Drain and Source Diffusions Contacted by Continuous Bit Line Conductors and Methods of Forming" by Jack H. Yuan and Jacob Haskell, field on Sep. 22, 2000, which are all assigned to SanDisk Corporation and which are all hereby incorporated herein by this reference, can store upwards of four logical bits per physical floating gate storage transistor. This storage will require each floating gate to be able to have encoded within it one of the sixteen or more possible memory states. Each one of these memory states corresponds to a unique value, or, more accurately, a narrow range of values, of stored charge on the floating gate which is sufficiently separated from its neighboring states' charge storage values to clearly differentiate it from those neighboring states as well as the other states.

The determination of a cell's stored charge level can be performed by current sensing, where the magnitude of its conduction using fixed bias conditions is sensed, or through threshold voltage conditions, where the onset of such conduction is sensed using varied steering gate bias conditions, to give two of the more standard arrangements. Current sensing approaches are more fully developed in U.S. Pat. No. 5,172,338 and U.S. patent application Ser. No. 08/910,947, which U.S. Pat. No. 6,222,762 were both incorporated by reference above, and may be employed with the various embodiments described below. However, the majority of the following exposition uses the threshold voltage, $V_{th}$, sensing approach as this improves the sensing resolution, keeps the current, and consequently the power, associated with massively parallel read operations low, and minimizes vulnerability to high bit line resistance.

The actual sensing can be performed in several ways, for example by comparing a cell's threshold voltage to each of the reference values in order. For multi-state cells, it can be more efficient to exploit a cell-by-cell, data conditional binary search, which, for example, is capable of determining, in parallel, each sensed cell's $V_{th}$ to a one in sixteen resolution through a sequential, four-pass sensing operation. The amount of resolution required for sensing is discussed below with respect to the various embodiments presented. As usual, the amount of resolution used is often a tradeoff between higher resolution, resulting in more potential "bits" beyound the minimum required 4-bit resolution of the exemplary embodiments, but at the cost of more area, to sense and store these extra bits, as well as more time consumed, both due to the additional sensing passes in the binary search of these extra bits and due to transferring this extra information.

To extract the data stored in the memory cells, this data must be both written and stored with sufficient fidelity. At the time of programming, the range of values associated with each storage state within the data unit being written, such as a sector, should be confined to a consistently tight range, and the separation between the center of each of these ranges and their associated nearest neighbors, that is, the states with a $V_{th}$ adjacent just above and below, within the unit being written can also be maintained within a constantly controlled target range. Once the data is written, the stored charge levels within the population of cells will, to first order, maintain their levels over time, with drift from these values in a common mode being a second order effect and dispersion being even less significant.

When reading a data unit, the storage state of each of the cells within that unit should be resolved by the sensing circuitry with a sufficiently high precision and resolution to adequately resolve the range of each storage band and the separation between each of the adjacent bands. It should be noted that this does not require that the user data associated with each of these states is known, merely that the states contained therein are read back with sufficient fidelity. Those cells which can not be read, or, alternately, be programmed or store data, with sufficient fidelity can be treated with error correction code (ECC) or other equivalent error management, such as is described in U.S. Pat. No. 5,418,752, which is hereby incorporated herein by this reference.

Under these arrangements, the minimal requirements of sensing are that it only needs to resolve each cell's storage with sufficient fidelity. In this way it is able to recreate the level relationship each cell has with all the other cells within the concurrently written storage unit or sector. It is not essential that the absolute data that these values represent be established at this time, as long as there can be extracted from this information a key or translator to provide such a mapping or discrimination filter between the resolved storage levels and the corresponding states. In the absence of such a key, this imposes the additional requirement of absolute referencing to recreate with sufficient precision the exact operating conditions present at the time the data was originally written in order to allow an accurate translation of the levels to data. Any inaccuracy in such translation must be guard-banded, increasing the margin requirements of the states and consequent memory window. Since a memory window of usable threshold voltages is of limited size, due to reliability and dynamic range considerations, this would limit the number of levels encodable and, consequently, the number of physical bits stored in a physical memory cell.

Even given such an absolute reference capability, in the case where, when read at some time in the future, there is a common mode shift in the read back levels relative to the levels established at the time of the original write, as could occur at high write cycle endurance levels which are vulnerable to "relaxation" due to cell detrapping, such absolute referencing does not help—the translation between levels read back and data is no longer the same. Given this, plus the very difficulty in guaranteeing such absolute referencing capability in volume production, over years of data storage and operation, wide ranges of operating temperatures, and the various target supply levels and associated ranges that end products may be expected to satisfy, it is often preferred not to depend on such "absolute" referencing, but rather to depend on "relative" capabilities inherent in the storage medium.

This can be accomplished by burying the translation key within the medium, often within the data sector unit itself. In the embodiments below, an additional number of physical cells, overhead reference or "tracking" cells, can be introduced within each sector to support this function, such as described in U.S. Pat. No. 5,172,338 and U.S. patent application Ser. No. 08/910,947, now U.S. Pat. No. 6,222,762, which were both incorporated by reference above. For most embodiments, these cells are, in all respects, the same as the user data cells, except they contain known data or storage levels established by the controller, firmware, or some combination of these at the time of data write. They can be attached to the user data in a way analogous (as far as location and programming, although not in function) to ECC bits, as described in U.S. Pat. No. 5,418,752, which was also incorporated by reference above. Each data sector then contains both the user data cells, but can also contain the tracking cells, the error correction code cells, header, and so on which are not directly used for storing data. In embodiments with both tracking cells and ECC cells, both can used to increase reliability of the memory in a complementary manner, with the ECC cells used to correct the data values and the tracking cells used to read both the user data and ECC cells.

In most of the embodiments described, the tracking cells are treated the same way as user data cells, benefiting from rotation and any other wear leveling strategies, so that most accurately reflect the history of their associated user data designated cells. The rotation of user data can be tied to the rotation, or toggling, of tracking cells as described below, or else treated independently. Since the tracking cells' rotation information can be extracted by comparing their threshold levels, the rotation of user cells can then be determined from the tracking cell rotation. As the tracking cell rotation can be treated as a function of the user cell rotation, by correlating this information, the memory can save on overhead since extra cells need not be allocated to store user cell rotation information. The description below gives several variations on the use of writable tracking cells which can be used, either individually or in conjunction, to improve upon the methods of U.S. Pat. No. 5,172,338 and U.S. patent application Ser. No. 08/910,947, now U.S. Pat. No. 6,222,762.

By reprogramming the tracking cells each time the associated user cells are programmed, the tracking cells develop the same history and therefore the same charge retention characteristics as the user cells. For example, if user cells' thresholds drop on the average by 10 mV after 10 years, the tracking cells' thresholds will on average drop by the same 10 mV. By reading the tracking cells at the same time as the user cells and using the tracking cells to determine the expected threshold voltages for each logic level, this charge loss does not degrade the effective margin of the user cells.

Also, it is well know that non-volatile memory cells' charge retention characteristics change as a function of the number of program/erase cycles performed. By having tracking cells erased and reprogrammed roughly the same number of times as the user cells, this cycling dependence on charge retention is also accounted for and does not reduce the effective cell threshold margin.

The threshold of tracking cells may be read using either analog or digital techniques. One example of an analog technique includes programming the tracking cells to thresholds between those of the user cells in one of $N=2^n$ states, as illustrated schematically in FIG. 1. (Both FIG. 1 and FIG. 3, below, are idealizations where all of the cells are in one of a number of individual values instead of the more realistic ranges of values.) In this case differential sensing may be used directly to compare individual tracking cell thresholds to user cell thresholds with the same control gate voltage, $V_{CG}$, applied. FIG. 2 shows a block diagram of such an analog arrangement, with $V_{CG}$ applied to both the user cell 22 and a tracking cell 21 that distinguishes between level i and i+1, the output of both cells being fed to differential amplifier 23 to determine if $V_{th}$ of the user cell 22 is above or below that of tracking cell 21. By comparing the user cells to the tracking cells programmed to various levels, the logic state of the user cells is determined. These comparisons may be a linear search, comparing each cell to each tracking cell, or a binary search, reducing the number of comparisons required.

Another method using analog sensing of the tracking cells to be programmed to the same thresholds as those of the user cells, as illustrated schematically in FIG. 3. In this case, during the read operation multiple tracking cells are used to determine the appropriate control gate voltages for reading the user cells, as shown in FIG. 4 and developed more fully in U.S. patent application Ser. No. 08/910,947, now U.S. Pat. No. 6,222,762. Here the tracking cells 41 and 42 have different programmed thresholds, corresponding, respectively, to states i and i+1. Their respective sense amplifiers, SA 43 and SA 44 feed back to the cell control gates in a manner such that the output of the sense amplifier is the threshold of the tracking cell. Multiple sense amplifier outputs are then input to a circuit, V AVERAGE 45, which determines the appropriate intermediate control gate level for reading the user cells, here represented by the single cell 46. Sense amp SA 47 then determines whether the threshold voltage of the user cell 46 is above or below this intermediate value, as indicated by the output 0/1. In FIG. 4, the appropriate control gate voltage for user cell 46 is an intermediate value between the threshold voltages of the two tracking cells 41 and 42. By combining appropriately programmed tracking cells, threshold values representing values between each of the programmed states may be derived and used for determining the logic level of the user cells.

Digital Techniques

Other methods for using tracking cells involve reading multiple digital values for the tracking and user cell thresholds, then using digital processing techniques to determine the user cells' logic level are described in U.S. patent application Ser. No. 08/910,947, which was included by reference above, will now be more fully developed. One such method starts by programming tracking cells to the same thresholds as those of the user cells, as in FIG. 3. A read operation then consists of applying a series of fixed control gate voltages, $V_{CG}$, to the tracking cells and simultaneously to the user cells. As shown schematically in FIG. 5, these control gate voltages span the entire range of the expected cell threshold values. By applying a series of control gate voltages $V_{CG}$ such as indicated in FIG. 6, digital values representing the cell's thresholds are determined. For example, if 16 different control gate voltages are available, a $\log_2(16)=4$ bit digital value may be determined. If a 7 bit value is desired, than $2^7=128$ different control gate voltages are required. As above, these control gate voltages may be applied in a linear sequence or in a binary search fashion. The number of bits, m, used to read and store the threshold value must be at least as large as the number of logical bits of information stored in each user memory cell, n.

(Alternately, rather than varying the control gate voltage, the sense amp trip current may be altered to determine some or all of the digital bits representing the cell threshold. Current based reading techniques are discussed, for example, in U.S. Pat. No. 5,172,338, which was incorporated by reference above. However, when the number of multi-states storable on a given floating gate becomes large, the voltage based techniques are often preferred for the reasons stated above.)

In FIGS. 4a and 4b of U.S. patent application Ser. No. 08/910,947, now U.S. Pat. No. 6,222,762 the case of 4-level and 8-level, respectively corresponding to n=2 and n=3, are shown in some detail. These figures correspond to a more fully developed version of FIG. 5, where the states are shown to correspond to a distribution of threshold values and margin values are included. In particular, the 4-state cell with 7-bit resolution, corresponding to n=2 and m=7, is developed. The n=4, N=16 state cell of the exemplary embodiment here will also be discussed in terms of an m=7 resolution.

Once these digital values are determined, they are used to determine the stored logic levels of the user cells. One method consists of calculating the digital mid-points between the threshold values of the tracking cells programmed to adjacent threshold states. For example, one tracking cell programmed to logic level i may have a digital threshold value stored as 0001110. Another tracking cell programmed to logic level i+1 may have a digital threshold value stored as 0001010. The digital midpoint between these two values is 0001100. Therefore all the user cells with threshold values read as greater than 0001100 are determined to have a logic level of i+1 or higher. All the user cells with threshold values less than 0001100 are determined to have a logic level of i or lower. By repeating this process with multiple sets of tracking cells, the specific logic level of each user cell may be determined.

An alternative method for determining the digital breakpoints between logic levels consists of programming tracking cells to non-adjacent logic levels. As long as the memory system knows in advance which logic levels are represented by the various tracking cells, the digital threshold breakpoints between logic levels may be determined without having to program tracking cells to every logic level. In this method, some assumption is made about the shape of the curve of the threshold vs. logic level. For example, FIG. 7 shows such a system in which, here, a linear relation is assumed between the thresholds and the logic levels. In this case, linear interpolation is used to determine the threshold breakpoints between the logic levels.

FIG. 7 shows a threshold-logic level relation derived from just two points, 70 and 71, corresponding to a single pair of tracking cells, or more generally a pair of tracking cell populations. For simplicity, these two cells are taken to be associated with the lowest logic level, 0, and the highest logic level, N. (Equivalently, both here and in the rest of the discussion, the states could be ordered in reverse fashion, with "0" corresponding to the highest $V_{th}$ and so on.) The logic level corresponding to the tracking cells or tracking cell populations is established by the controller, firmware, or some combination of these at the time of data write. The corresponding $V_{th0}$ and $V_{thN}$ is established by reading these cells, the $V_{th}$ vs. logic level curve determined to provide the threshold voltages of the states, and the logic level differentiating break points, $BP_{i,i+1}$, along with any marginning values are extracted. For embodiments differentiating between the "0", or ground, logic state and a lower, post-erasure "erased" state, an additional breakpoint $BP_{0,e}$ would be included below $V_{th0}$.

Using fewer tracking cells or populations of tracking cells than the number of states reduces the number of required tracking cells as well as the corresponding amount of overhead needed for these cells. In the exemplary 4-bit embodiment, the use of tracking cells associated with only two states results in a factor of 8 reduction in the number of tracking cells compared to using cells associated with each of the $2^4=16$ states.

Although FIG. 7 used the highest and lowest logic states, these are generally not the preferred choice. One reason for not using these states is that they are relatively far, in terms of threshold values, from the intermediate logic states and therefore do not reflect these values as accurately. If the tracking cells instead correspond to a pair intermediate logic levels, at, say, roughly a quarter and three quarters of the way between the highest and lowest level, the average distance between the pair of logic levels corresponding to the tracking cells and the other logic levels is reduced. This will consequently result in better margins for the read process.

Another reason for not using the highest and lowest logic states is these do not correspond as well to a "typical" data cell. One of the motivations for using writable tracking cells is that the tracking will have a fairly typical history when compared with the user cells. To more accurately reflect the history of their associated user data designated cells, as well as provide a more accurate $V_{th}$ vs. logic level relation, the use of logic states nearer the middle logic levels is generally more accurate. For example, if N=16, the states associated with, say, logic levels 4 and 12 would be more representative. So that the same cell, or population, is not constantly rewritten to either state 4 or 12, the states can be rotated, as described in U.S. patent application Ser. No. 08/910,947, now U.S. Pat. No. 6,222,762 and developed more fully in U.S. Pat. No. 5,270,979, which is hereby also included herein by this reference. Thus, although the tracking cells are not rotated through all the possible logic state, by being rotated between being programmed to a relatively high and a relatively low $V_{th}$ state, they will approximate the history of a typical user cell.

In most embodiments, these cells are re-programmed each time the user cells of the associated write block are written, preferably at the same time, using the same fixed, global reference levels to set the tracking and user cell programmed thresholds. These verify reference can be produced, for example, by band-gap voltage reference generators or other standard techniques. These can be used to generate all of the needed reference voltages, or else a fewer number with the other needed levels supplied by the same algorithm that produces the read break points from the tracking cells, as is described in more detail below with respect to analog embodiments. The threshold voltages of the tracking cells are also preferably read every time the user cells are read, and these thresholds are used to determine the stored logic levels of the user cells.

FIG. 7 assumes a linear relation between logic levels and their correspond threshold values. The actual shape of the $V_{th}$ vs. logic state curve will depend both upon how the cells are programmed and how they maintain this programming level over time and in varying read conditions. Typically, cells are programmed in a program/verify cycle which uses a series of program verify levels which are uniformly spaced, resulting in a linear relation at the time and conditions that programming is completed. Non-linearities may result when the verify levels differ from their nominal values. Alternately, a non-linear relation could intentionally be introduced to exploit, for example, a known voltage dependent aging property of the cells or to compress the number of states stored in more stable portions of the available threshold window. Such intentional non-linearities can be compensated for by the $V_{th}$ vs. logic state curve, and can be computed in the controller or more directly as described below with respect to analog embodiments.

To lowest order, if the cells are programmed to a particular $V_{th}$ vs. logic state curve, they will retain this curve. To higher order, with time and varying read conditions, cells with different threshold values will deviate by differing amounts. These effects can be compensated for by using a more complex curve. In FIG. 8, tracking cells are programmed to three different logic levels, here taken as the states 2, N/2, and (N−2). This allows extraction of a non-linear relationship between threshold and logic level. In FIG. 9, 4 logic levels are used to allow extraction of an even more complex non-linear relationship between threshold and logic level. In general, when more than two logic levels are used, the curve can either be constructed to be piece-wise linear, or else a curve of higher order. If taken to be piece-wise linear, it would be assumed linear between each pair of points, with the any needed extrapolation beyond the lowest and highest level tracking cells either just being a linear continuation or else based on some assumed behavior of cells near the "0" and "N" states. If K populations of tracking cells are used, each associated with a different logic level, a curve of up to order of(K−1) (or higher if assumptions are made on the boundary behavior) can be extracted. Alternately, a curve of order less than (K−1) could be formed using least squares, cubic splines, or other standard techniques.

So far, the embodiments presented have, usually implicitly, assumed that each population of tracking cells associated a particular logic level consists of a single cell. In other embodiments, multiple tracking cells are used in each population, with each of the populations programmed to one of two or more logic states. The advantages of using multiple tracking cells associated with a given logic level are discussed in U.S. patent application Ser. No. 08/910,947 included reference above. This method allows for the inevitable non-ideal threshold levels of the tracking cells as shown in FIG. 10, where two populations of 16 cells each are used. Mathematical regression methods may then be used to determine a best fit of the threshold vs. logic level curve.

In the example of FIG. 10, the two populations of tracking cells associated with logic levels 4 and 12. (The spread in threshold values is exaggerated over that found in actual practice so that they do not appear coincidental on the scale used.) The threshold values in each population can then be averaged in a number of ways, for example a mean, weighted mean or mean with outlying values neglected, or a root mean square or mean based on other powers. From the average of each population, the linear relation can then be extracted. Alternately, rather than averaging the individual populations first, a least squares or other regression could be performed using all of the tracking cells, this being a distinct process if populations associated with more than two levels are used. Of these variations, the use of a simple arithmetic mean formed from each of the two populations (with possible outliers such as the over-programmed tracking cell indicated by 101 in FIG. 10 cut off) is typically the simplest and fastest implementation, with the computation involved in higher order curves requiring more processing.

In the event a "bad" tracking cell which fails to program properly, this can either be mapped to an alternate cell in the same way as is done with the user data cells, or, more simply since it contains no user data, just switched out of the population. For example, if upon initial testing, a tracking cell fails to have a threshold around a test state, the defecting cell can be switched out by the supplier. Additionally, if the cell fails to verify properly during a program or erase operation, it can be switched out at that time. Furthermore, even among the "good" tracking cells, some may be ignored: For example, there may be a tracking cell, again such as that indicated by 101 in FIG. 10, which cannot be identified as "bad", but whose threshold will be substantially different from other tracking cell due to, say, overshoot in programming. During the processing of tracking cells, this "good" tracking cell with a "bad" value can also be removed by ignoring any tracking cells in the calculation of breakpoints whose threshold voltage is a certain distance away from the average threshold voltage of all the tracking cells programmed to the same level. This distance could be a bound based on either a relative difference or absolute difference in the threshold value of the cell.

For any of these methods, whether the populations of tracking cells consist of one or many points, these populations may be associated with only a subset of the total number of logic states. In particular, the example of FIG. 10 has only two populations for the 16 possible logic states to which a user cell can be programmed. The result is that the generic breakpoint for distinguishing between a pair of logic states is not determined by the threshold voltages of the logic states between which it differentiates. For example, the breakpoint $BP_{5,6}$ is determined by populations associated with neither of logic states 5 and 6.

The actual threshold voltages of the tracking cells can be used to translate the threshold values of the user cells back into data values in a number of ways, both analog and digitally based. In one set of embodiments, the full m bits of the threshold information for the tracking and for the user cells is off-loaded to the processing circuit, which does the m to n bit translation. This processing circuit could be the controller which, depending on the embodiment, is contained on another chip from the actual memory cells, or contained on the same chip. In addition to its other functions, such managing the memory and transferring data from the host system, the controller could then compute the linear or higher order $V_{th}$ vs. logic state translation curve. Variations on this process for a 4 state user cells using m=7 bit resolution are presented in U.S. patent application Ser. No. 08/910,947, now U.S. Pat. No. 6,222,762, as noted above. For the present 4-bit user cell example, both the tracking and user cells could be read to 7-bit accuracy, the breakpoints determined, and the threshold values of the user cells converter to data values. Alternately, only the tracking cells could be read to 7-bit accuracy, their values converted to 4-bit breakpoint voltages, and the user cells read directly with these 4-bit breakpoint voltages to determine their data content.

As reading is a faster process that programming, reading at 7-bit accuracy while programming to 4-bit accuracy, based on the fixed global verify values, does not result in near the loss of speed that using 7-bit accuracy for both processes would produce. Particularly when the read process uses a binary search, the cost of 7-bit accuracy just for read is much less than losses that would come from a full 7-bit implementation.

Given the above options, there a number of various embodiments using writable tracking cells in different ways and in different numbers. Given that the key objective is to establish the proper, or at least optimal, translation between measured states and stored data, the function of the tracking cells is to pin down this optimum translation.

If the sensing circuitry maintains its linearity, or at least its consistency if not linear, then the translation transform becomes essentially a straight line fit with a slope and intercept established by two sets of tracking cells, each set at some optimum state to minimize the error of such fitting. Despite the capability to tightly confine a population of cells within any given state, since there is invariably some spread in any group, including the tracking cell groups, this suggests that there be a sufficient number of such cells to establish, statistically, the center of each population. In this way, guard-bands against errors associated with establishing the translation can be increased by as much as one-half of the spread. For example, if memory states are separated by two such full spreads (that is, a full spread is maintained as separation between the outer edges of each neighbors states' distributions), then a reference established from the center, or extremely near the center, will give the maximum margin to differentiate between that state and its nearest neighbor. If too few tracking cells are used in a population, then there is the chance of setting this reference value from close to the extreme of a population, robbing sensing margin equivalent to 25% of the state to state separation. The optimum number of cells is a trade off between overhead area, and consequently cost, versus precision; but even a relatively small population, ranging from 10 to 30 cells should be sufficient in many applications. The cost of such overhead per sector is relatively small. For example, in a write sector containing about 1024 user data cells, which at 4 bits or ½ Byte per cell gives 512 Bytes, the 16 cells in each of two tracking cell groups of FIG. 10 amounts to only around a 3% overhead area cost.

If, however, some non-negligible amount of varying distortion is inherent within the sensing operation, such that there are non-linearities in the transformation that are different between the time of write and later reads, tracking cells associated with more than two states may be needed. In the extreme case, this would require each state to be represented. In order to keep the corresponding overhead increase under control, this would suggest reducing the number of cells per population associated with a state. In most applications, this extreme case is unlikely. It may be, however, that using 3 or 4 different state populations, such as is shown in FIGS. 8 and 9, provides a reasonable compromise between the two limits.

As already noted, the processing associated with establishing the translation can take place in several different places. In the one option, this can occur within the controller, in which case the digitized threshold values of the tracking cells need to be shifted out from the memory to the controller with the full resolution available at the outset of the read to establish the translation. The remainder of the data can then be shifted out at this same resolution and have the controller process this data using the translation to extract the 4-bit data per cell, which, for a given I/O bus width and clock frequency, reduces the information transfer rate and increases power consumption. Alternately, the translation terms can be shifted back to the memory, for example filling up an on-chip fast look-up table RAM and used to process the remaining data on the memory chip. The translation can be done at the same time as shifting out the data, thereby shifting out only the 4-bit data of interest and minimizing loss of read speed and reducing the power associated with this data shifting. Another option is to perform the translation on the memory chip itself, by placing the controller on the same chip, and/or by establishing what associated voltage best satisfies the population of tracking cells associated with each predetermined state in a first pass sensing session, and from these values adjusting the full set of voltages used to read the 16 levels from the user cells in a second sensing session. Placing the controller on the same chip as the memory cells results in a savings in both time and power as it avoids the transfer of data on an input/output bus.

Analog Techniques

FIG. 11 is a block diagram of an embodiment where the user cells are read directly with analog voltage levels derived from the tracking cells. Although many of these details will also apply to the digital implementations above, in the analog embodiments the threshold voltages of the tracking cells are not converted to digital values, but used in their analog form to set the read voltages directly for translating the threshold voltages of the user cells into data. Each data sector within the memory is preferable provided with such a circuit.

In FIG. 11, a first set of L tracking cells, $TC_{1,1}$ 1111 to $TC_{1,L}$ 1112, are connected to an averaging circuit $AVE_A$ 1110. A second averaging circuit $AVE_B$ 1120 is connected to a second population of tracking cells, here taken to also have L elements. Based on the threshold values of these tracking cells, the two averaging circuits determine the two voltages $V_{aveA}$ and $V_{aveB}$ associated with two of the logic levels from which the various read points are determined. In the more general case where populations associated with more than two logic levels are used, there would be one such averaging circuit per population. The $V_{ave}$S are then supplied to the circuit 1130 for establishing the read points used to translate the user cell's threshold voltages into data.

Besides the $V_{ave}$S, circuit 1130 may receive several other inputs. Since the states A and B to which the two populations correspond is rotated to provide a more uniform history, circuit 1130 determines which population corresponds to which level. For example, in an embodiment corresponding to FIG. 10, one of these corresponds to logic level 4 and the other logic level 12. To determine which is which, circuit 1130 can either just directly compare these voltages, or else this information can be supplied by the controller, firmware, or wherever this information has been stored as a control signal, here labelled ROT. More generally, this could also contain information about changes in how these populations are associated. Since, as described below with respect to FIG. 14, the same circuitry 1130 is also preferably used for program verify and other reading operations besides data extraction, global fixed program verify voltages, $V_{PVhi}$ and $V_{PVlo}$, corresponding to each of the logic levels associated with the two populations are also supplied. A control signal, here called PGM, is then used to decide whether the $V_{ave}$s or the $V_{PV}$s are used to set the read points.

The read points are then supplied to READ/VERIFY circuit 1140. This can consist of only supplying the particular read points used for the operation then in process, for instance the breakpoints for data extraction, or else a larger number of sets of the voltages described with respect to FIG. 14 can simultaneously be supplied. These read values are then used for the various read operations performed on the user data cells. Here, a single cell 1150 is shown to indicate the whole read sector with which the circuit of FIG. 11 is associated. The circuitry of READ/VERIFY circuit 1140 then uses the read points to extract the data from the cell, for example by applying the various breakpoints to the control gate and monitoring the result with a sense amp as in the simplified arrangement of FIG. 6. (The programming circuitry for the tracking and user data cells is suppressed here to keep these figures simplified to the elements being discussed, but is shown, for example, in U.S. Pat. Nos. 5,172,338 or 5,418,752, or U.S. patent application Ser. No. 08/910,947, now U.S. Pat. No. 6,222,762, all included by reference above.)

FIG. 12 shows an embodiment of the circuit $AVE_A$ 1110 and its tracking cells in more detail for the case of L=16. The other averaging circuit are similarly constructed. Each of the tracking cells $TC_{1,1}$–$TC_{1,16}$ are constructed and programmed similarly to the user memory cells. These are each connected to a respective analog sense amp, each fed by the same reference current $I_{ref}$. For instance, tracking cell $TC_{1,1}$ 1111 is connected to analog sense amp SA1 1211. Using the reference current $I_{ref}$ as an input, the sense amp outputs the threshold voltage of $V_{th1,1}$ of tracking cell $TC_{1,1}$. After passing across resistor 1241, this voltage is then combined with the other threshold voltages $V_{th1,2}$–$V_{th1,16}$ to produce the average value of the tracking cells associated with the logic level A, $V_{aveA}$. The output of each sense amp also passes through a transistor such as 1231 for analog SA 1. This is a provision for switching out any "bad" tracking cells. If, for example, the tracking cell is found to not program properly during initial testing, the chip provider can use transistor 1231 to remove the tracking cell from the population. Alternately, if a tracking cell fails to verify when written or erased at some later date, it can be switched out at that time. Although the embodiment of FIG. 12 provides a dedicated sense amp for each tracking cell, alternate embodiments could allow tracking cells to share sense amps if the appropriate switching circuitry were provided. Of course, in the case that a tracking cell population consists of a single cell, only the single threshold voltage is supplied and the averaging is not needed.

One embodiment of an analog sense amp connected to its tracking cell is shown in FIG. 13. A reference voltage $V_{ref}$, from band-gap voltage reference generator or other source is applied to the control gate of transistor 1301 to provide the reference current $I_{ref}$ to the sense amp 1211, producing a current to the source of tracking cell TC 1111. A pair of p-cascode devices, 1311 and 1312, followed by a second pair of cascode transistor, 1321 and 1322, with respective cascode biases are interposed between the tracking cell and transistor 1301. A node N1 is between the two set of cascode devices and is connected to the control gate of a transistor 1330. Between the transistor 1330 and a transistor 1340 connected ground and controlled by a bias current, a second node N2 is connected to the control gate of the tracking cell 1111. In this arrangement, the transistor 1330 will act like a source follower and set the voltage at N2 to the same level as the threshold voltage of the tracking cell, $V_{th1,1}$. The pair of cascode devices on either side of node N1 are used to boost the gain of the feedback loop.

FIG. 14 is a particular embodiment of the read point circuit 1130 of FIG. 11. The voltages $V_{aveA}$ and $V_{aveB}$, or more generally all of the averaged voltages from the tracking cell populations, are received at a switching circuit such as 1402. Since, as described above, it is often preferable to rotate the tracking cell populations between the logic states with which they are associated, the $V_{ave}$s need to be connected according to which state they currently associated. For the case of two values, a simple circuit such as 1402 will connect $V_{aveA}$ to $V_{aveHI}$ and $V_{aveB}$ to $V_{aveLO}$ if the control signal ROTAB is de-asserted, and rotate these two connections if ROTAB is asserted. This correspondence between tracking cell populations and the logic levels is determined in a rotation determination circuit, shown here as block 1401. The inputs are the various $V_{ave}$s, one or more signals containing the correspondence from the controller or wherever this information is stored, or a combination.

In the case where the tracking cell populations are always associated with the same set of logic levels, block 1401 could determine the correspondence simply by comparing the values of the $V_{ave}$s with one another. For example, in FIG. 14 by asserting or de-asserting ROTAB based on whether $V_{aveA}$>$V_{aveB}$. Alternately, ROTAB could come directly from ROT. The additional control signals, $CS_i$, allow for changing the set of states with which the tracking cells are associated. In the simplified embodiment without rotation, circuit 1402 would be absent and the averaged values would be applied directly to the corresponding node or op-amp.

Once the $V_{ave}$s are properly connected, they are then used to set the voltages of their corresponding logic levels in a chain of resistor elements. Rather than apply $V_{aveHI}$ and $V_{aveLO}$ directly to their corresponding node, they are connected to a corresponding op-amp, respectively 1421 and 1422, which act as buffers. Ignoring for a moment transistors 1431–1436, consider the second input of these op-amps as connected directly to respective nodes Y and X. In FIG. 14, the pair of tracking cell populations are associated with logic levels 3 and 13 when connected to nodes X and Y. Each logic state i then corresponds to the node above resistor $R_i$. If the resistors $R_0$–$R_{15}$ are all equal, a linear relation such as is shown in FIG. 10 will result. Any variations in the resistance values, whether intentional or due to process variations, will produce a non-linear relation unless compensated for elsewhere.

To allow for the set of tracking cell populations to correspond to different tracking cell populations, a set of transistors, such as 1431–1433 and 1434–1436, can be included. By use of a set of control signals, here shown schematically as $CS_a$–$CS_c$, the higher logic level associated with a population of tracking cells can be taken logic level 12, 13 (at the node Y), or 14. Circuit 1401 would then supply the signal to turn on the appropriate transistor, the others being off. The lower level is set in a similar manner using transistors 1434–1436 and signals $CS_d$–$CS_f$.

In order that the same $V_{th}$ vs. logic level relation used to read the cells is also used to program the cells, the same read point circuit can be used for program verify (and any other read operations) as is used for data extraction. When the input to op-amps 1421 and 1422 are connected to $V_{aveHI}$ and $V_{aveLO}$, the node above each resistor $R_i$ is at the voltage $V_{avei}$, taken to the average threshold value of the logic state i for translating $V_{th}$ of a user data cell to a logic level at the time of data extraction. If, instead, the input of these op-amps were connected to the program verify voltages, shown here as $V_{PVhi}$ and $V_{PVlo}$, these nodes correspond to levels of the logic level when they are verified into a programmed state at the end of a write cycle. In the embodiments where the tracking cell are programmed the same as the user cells in their associate logic state, the same resistor chain is used to program both the user and tracking cells in a sector. For example, at the end of programming, if one of the tracking cell populations is associated with logic state 3, both the cells of this population and user cells programmed to this logic level will correspond to the node X.

To allow for this multiple use of the resistor chain, a switch is provided to connect either the $V_{ave}$s or the $V_{PV}$s to the appropriate op-amp. This is just shown schematically in FIG. 14 as the pair of switches $S_H$ 1411 and $S_L$ 1412, which can be implemented by any of the standard arrangements and would operate together, with $S_H$ and $S_L$ respectively connected to $V_{aveHI}$ and $V_{aveLO}$ for data translation reading and respectively connected to $V_{PVhi}$ and $V_{PVlo}$ for program verify reading. Switches $S_H$ 1411 and $S_L$ 1412 would then be operated in response to an appropriate control signal, such as the program signal PGM indicated in FIG. 11, which would connect the resistor chain with the verify voltages when asserted and with the $V_{ave}$s when de-asserted. $V_{PVhi}$ and $V_{PVlo}$ would be the global, fixed voltage reference values used for read verify during programming, generated by band-gap voltage reference generators on the chip or other standard techniques.

By using the circuit 1130 for both putting the data on and taking data off the memory cells, non-linearities introduced into the $V_{th}$ vs. logic level relations during programming are automatically compensated for when translating the threshold values back into logic states. This occurs whether the non-linearity is intentional or not. For example, device mismatches due to process variation can produce a non-uniform spacing of threshold ranges; however, as the same mismatches occur when translating back the user cells to logic level, this effect is largely undone. Alternately, a design choice may be made to pack states more densely into, say, the lower portion of the threshold window. This can be accomplished by taking the values of the resistors on the bottom of end of the chain to a smaller values than those at the top. The non-linearity is then automatically introduced during programming and removed during reading without the sort of loss in performance a computational implementation would introduce. Similarly, to reduce the effects of other device mismatches on read/write and tracking/user cell asymmetries, the same device is used on the drains of both reference cells and data cells for their respective analog sense amps and read sense amps, with the same current mirrors used for the reference currents.

So far, the discussion of FIG. 14 has only discussed the center of the $V_{th}$ distributions, centered on the voltage at the nodes between the resistors $R_i$, and not discussed the actual intermediate breakpoints used to distinguish between states and how these are generated. FIG. 15 is a detail of FIG. 14 showing one of the resistors $R_i$ and where it is tapped to provide the various values used.

Each resistor $R_i$ is broken up into a sub-chain of resistors, here taken to be eight resistors $R_{i,0}$–$R_{i,7}$, to provide the breakpoint read points and other intermediate values used in reading processes. Here the breakpoint $BP_{i,(i-1)}$ is set midway between what is taken as the average values taken for the threshold voltages of the states i and (i-1), $V_{avei}$ and $V_{ave(i-1)}$. Other read points are pulled off in the same way. A low marginning value for the state i and a high marginning value for the state (i-1), $V_{mli}$ and $V_{mh(i-1)}$ respectively, are shown as lying on the node just above and below that of $BP_{i,(i-1)}$. How close the margining values are taken to the corresponding $V_{ave}$ value will determine how tightly the distribution is clustered about this value when written. The number of nodes is determined by the amount of resolution desired and the number of distinct sorts of read points desired, such as the various read points described in U.S. Pat. No. 5,532,962, which is hereby included herein by this reference. Again, depending upon the desired operating characteristics, the resistors $R_{i,0}$–$R_{i,7}$ of the sub-chain can be taken with non-equal values if a non-uniform spacing of the node values is wanted.

Alternate Programming of Tracking Cells

All of the embodiments described so far have largely assumed that the tracking cell are programmed in the same manner as the user data cells. These reference cells are then written with the same algorithm as the user cells, using programming pulses of the same intensity, with the same duration, and verified at the same level. Although this produces similar histories and distributions for both the tracking cells and the user cells, in some applications an embodiment that programs the tracking cells differently may be used.

Writable reference cells have uncertainty in their written threshold values. When using this threshold to determine the logic level to which a user cell has been written, this uncertainty is a significant probabilistic error term. For example, consider the scenario where the written threshold uncertainty for storage cells may be 105 mV. If the reference cells have the same 105 mV uncertainty, then the voltage difference between a storage cell and a reference cell may be as high as 105 mV. If the voltage separation between levels is 200 mV, then there will be storage cells that will have thresholds closer in value to that of a reference cell for an adjacent logic level than to that of the reference cell for the appropriate logic level. This will cause a read error on such storage cells.

The written threshold uncertainty may be reduced by taking more time to write all reference cells and user cells. For example, shorter write pulses may be used. This results in a smaller threshold change for each write pulse, and therefore a finer resolution (less uncertainty) in the final threshold. However, this scheme implies that the cell is being checked against the target threshold more often, meaning more time is being taken for the read operations. This reduces the overall write speed, which may not be an acceptable tradeoff for some applications such as streaming video storage.

Instead of writing the tracking cells using the same voltages and timing as is used for the storage cells, resulting in the same threshold uncertainty for the tracking cell populations as for the storage cells, these two types of cells can be written differently. If threshold variation of reference cells is reduced, this reduces the read error term introduced by reference cell threshold uncertainty. Both the average and the maximum differences between the reference and user cell thresholds may be reduced. This may be done without significantly effecting overall write speed.

In one example, a lower control gate and/or drain voltage is used for reference cells than for user storage cells. Lower voltages reduce the programming speed for most non-volatile memory cell writing operations. If the same timing is used as for user storage cells, then the average reference cell undergoes less threshold change than the average user cell for the same amount of write time. Typically the write algorithm consists of multiple write pulses, with intervening comparisons of the cell threshold to a final target value. Therefor writing cells more slowly with less threshold change per write pulse results in less uncertainty in the final threshold.

However, even if the average reference cell is written more slowly than the average user cell, the slowest writing reference cell can usually complete writing to the target level as quickly as the slowest user cell. Consider the case where there are 1000 user cells and 20 reference cells per write block, and the cells' write speeds are normally distributed. With a 1000 user cells, the slowest cell writes $\sigma Q^{-1}(1/1000)=3.1\sigma$ a slower than the average cell, where Q=Gaussian cumulative distribution function and $\sigma$ is its standard deviation. For the 20 user cells, the slowest cell writes $\sigma Q^{-1}(1/20)=1.5\sigma$ slower than the average cell. Hence for a for typical distribution, the slowest user cell writes $3.1\sigma/1.5\sigma=2.07$ times slower than the slowest tracking cell. Therefore, the reference cells may be written about twice as slowly as the user cells, and consequently to about two times better resolution, without impacting the overall required write time for the total cell population. In the above example, the reference cell threshold uncertainty could be reduced from 105 mV to 105/2.07=51 mV. The largest difference between user cell and reference cell thresholds is thereby reduced from 105 mV to (105+51)/2=78 mV, a 26% improvement.

In another example, the same voltages may used for programming the user cells and reference cells, but different write timing may be used for the reference cells. Specifically, if shorter write pulses may be used for the reference cells, then they may be written to a better resolution. Consider again the scenario described above: 1000 user cells and 20 reference cells. Furthermore, consider a write/verify cycle where the verify time is 20% that of the write time. Given that we want the total write plus verify time to the same for the slowest user cell and slowest reference cell, we have the following equations:

$$\text{Total time to (write+verify) for user cells} = (T_{pu}+0.2T_{pu})N, \quad (1)$$

where $T_{pu}$ is the user cell write pulse width and N is the number of write pulses required for the slowest user cell. Similarly, $$\text{Total time (write+verify) for tracking cells} = (T_{pref}+0.2T_{pref})M, \quad (2)$$

where $T_{pref}$ is the reference cell write pulse width and M is the number of write pulses required for the slowest reference cell. Also $$\text{write time required for slowest user cell} = T_{pu}N, \quad (3)$$

and $$\text{write time required for slowest reference cell} = T_{pref}M. \quad (4)$$

The previous calculations show that the slowest user cell requires 2.07 times the write time of the slowest reference cell. Therefore $$T_{pu}N=2.07T_{pref}M. \quad (5)$$

Solving (1), (2), and (5) for $T_{pref}$ gives $$T_{pu}=7.7T_{pref}.$$

This states that the reference cell write pulse can be 7.7 times shorter than the user cell write pulse, and still complete writing of the slowest reference cell in the same time as the slowest user cell.

Therefore, the reference cells may be written to 7.7 times better resolution. In the case where user cell threshold uncertainty is 105 mV, this gives reference cell uncertainty of less than 14 mV. This reduces the largest difference between user cell threshold and reference cell threshold to (105+14)/2<60 mV. This can significantly reduce the error rate in using the reference cells to determine the correct logic level stored in the user cells. Conversely, this could allow logic levels to be placed more closely together, reducing the required threshold range, or possibly even allowing more levels to be stored per cell.

These calculations are probabilistic calculations and it may occur that a particular cell in a tracking cell population fails to verify in this time. As with the other embodiments above, where the tracking cells are programmed with the same algorithm as the user cells, the defective reference cell can either be mapped to a new cell or simply removed from the population as it contains no user data.

Using different timing for the tracking cells than for user cells results in control logic that is more complex, typically twice that of using the same timing for all cells. Writing the tracking cells will also require more AC power, since the shorter pulses required result in more signal switching. Also, potentially more noise may be generated by simultaneous writing of user cells and reading of tracking cells (and the also the other way around), creating an error term in reading the cell thresholds. These disadvantages may be more than offset, however, by the improved distribution of tracking cell thresholds.

Various details of the implementation and method are merely illustrative of the invention. It will be understood that various changes in such details may be within the scope of the invention, which is to be limited only by the appended claims.

What is claimed is:

1. A sense amp for providing an analog voltage level of a non-volatile memory cell connected between said sense amp and ground, comprising:
   a first transistor connected between a voltage source and a first node and having a control gate connected to a reference voltage;
   a second transistor connected between said voltage source and a second node and having a control gate connected to said first node;
   a third transistor connected between said second node and ground; and
   an output for providing said analog voltage connected to said second node, wherein said memory cell is connected between said first node and ground and has a control gate connected to said second node.

2. The sense amp of claim 1, further comprising:
   at least one cascode device connected between said first transistor and said first node; and
   at least one cascode device connected between said first node and said memory cell connected to the sense amp.

* * * * *